United States Patent
Chang et al.

(10) Patent No.: US 9,722,072 B2
(45) Date of Patent: Aug. 1, 2017

(54) MANUFACTURING METHOD OF HIGH-VOLTAGE METAL-OXIDE-SEMICONDUCTOR TRANSISTOR

(71) Applicant: UNITED MICROELECTRONICS CORP., Hsin-Chu (TW)

(72) Inventors: Kai-Kuen Chang, Keelung (TW); Chia-Min Hung, Hsinchu (TW); Shih-Yin Hsiao, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/173,728

(22) Filed: Jun. 6, 2016

(65) Prior Publication Data

US 2017/0025531 A1    Jan. 26, 2017

Related U.S. Application Data

(62) Division of application No. 14/805,474, filed on Jul. 22, 2015, now Pat. No. 9,391,196.

(51) Int. Cl.

| H01L 29/78 | (2006.01) |
| H01L 29/40 | (2006.01) |
| H01L 29/66 | (2006.01) |
| H01L 29/06 | (2006.01) |

(Continued)

(52) U.S. Cl.
CPC ...... *H01L 29/7816* (2013.01); *H01L 29/0653* (2013.01); *H01L 29/1083* (2013.01); *H01L 29/1095* (2013.01); *H01L 29/402* (2013.01); *H01L 29/404* (2013.01); *H01L 29/4238* (2013.01); *H01L 29/42368* (2013.01); *H01L 29/66659* (2013.01); *H01L 29/66681* (2013.01); *H01L 29/7833* (2013.01); *H01L 29/7834* (2013.01); *H01L 29/7835* (2013.01)

(58) Field of Classification Search
CPC ............. H01L 29/402; H01L 29/404; H01L 29/66659; H01L 29/0653; H01L 29/7834; H01L 29/7835; H01L 29/7833
USPC ............................ 438/267, 281, 304, 595
See application file for complete search history.

(56) References Cited

U.S. PATENT DOCUMENTS

| 7,453,127 B2 | 11/2008 | Wu |
| 8,803,234 B1 | 8/2014 | Liao |
| 8,987,818 B1 | 3/2015 | McGregor |

(Continued)

*Primary Examiner* — Walter H Swanson
(74) *Attorney, Agent, or Firm* — Winston Hsu (57) ABSTRACT

A manufacturing method of a high-voltage metal-oxide-semiconductor (HV MOS) transistor device is provided. The manufacturing method includes the following steps. A semiconductor substrate is provided. A patterned conductive structure is formed on the semiconductor substrate. The patterned conductive structure includes a gate structure and a first sub-gate structure. The semiconductor substrate has a first region and a second region respectively disposed on two opposite sides of the gate structure. The first sub-gate structure is disposed on the first region of the semiconductor substrate. The first sub-gate structure is separated from the gate structure. A drain region is formed in the first region of the semiconductor substrate. A first contact structure is formed on the drain region and the first sub-gate structure. The drain region is electrically connected to the first sub-gate structure via the first contact structure.

15 Claims, 10 Drawing Sheets

(51) Int. Cl.
*H01L 29/10* (2006.01)
*H01L 29/423* (2006.01)

(56) References Cited

U.S. PATENT DOCUMENTS

| | | | |
|---|---|---|---|
| 2004/0132264 A1* | 7/2004 | Yaung | ..................... H01L 27/15 |
| | | | 438/455 |
| 2005/0056846 A1 | 3/2005 | Huang | |
| 2006/0065928 A1 | 3/2006 | Nagai | |
| 2013/0161739 A1* | 6/2013 | Tseng | ..................... H01L 29/404 |
| | | | 257/336 |
| 2015/0200251 A1* | 7/2015 | Chi | ..................... H01L 29/513 |
| | | | 365/96 |
| 2016/0056232 A1 | 2/2016 | Kuo | |

* cited by examiner

FIG. 10

MANUFACTURING METHOD OF HIGH-VOLTAGE METAL-OXIDE-SEMICONDUCTOR TRANSISTOR

CROSS REFERENCE TO RELATED APPLICATIONS

This application is a division of application Ser. No. 14/805,474 filed on Jul. 22, 2015, now allowed, which is incorporated by reference herein in its entirety.

BACKGROUND OF THE INVENTION

1. Field of the Invention

The present invention relates to a manufacturing method of a high-voltage metal-oxide-semiconductor (HV MOS) transistor device, and more particularly, to a manufacturing method of a HV MOS transistor device for reducing leakage current.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency (HF) band power amplifier. While sidewall spacers become thinner in the advance process nodes, leakage current ($I_{off}$) of the DMOS will rise quickly because of the gate induced drain leakage (GIDL) effect and the heavier doped source/drain regions diffusing under the poly gate more seriously.

SUMMARY OF THE INVENTION

It is one of the objectives of the present invention to provide a manufacturing method of a high-voltage metal-oxide-semiconductor (HV MOS) transistor device. A first sub-gate structure separated from a gate structure is electrically connected to a drain region via a contact structure for improving a gate induced drain leakage (GIDL) issue.

A manufacturing method of a high-voltage metal-oxide-semiconductor (HV MOS) transistor device is provided in an embodiment of the present invention. The manufacturing method includes the following steps. A semiconductor substrate is provided. A patterned conductive structure is formed on the semiconductor substrate. The patterned conductive structure includes a gate structure and a first sub-gate structure. The semiconductor substrate has a first region and a second region respectively disposed on two opposite sides of the gate structure. The first sub-gate structure is disposed on the first region of the semiconductor substrate. The first sub-gate structure is separated from the gate structure. A drain region is formed in the first region of the semiconductor substrate. A first contact structure is formed on the drain region and the first sub-gate structure. The drain region is electrically connected to the first sub-gate structure via the first contact structure.

In the HV MOS transistor device of the present invention, the sub-gate structure is electrically connected to the drain region via the first contact structure for eliminating the electric potential difference between the sub-gate structure and the drain region, and leakage current from the drain region to a bulk region in the semiconductor substrate will be reduced accordingly because of the suppressed GIDL effect.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-3 are schematic drawings illustrating a manufacturing method of a high-voltage metal-oxide-semiconductor (HV MOS) transistor device according to a first embodiment of the present invention, wherein

FIGS. 6-8 are schematic drawings illustrating a manufacturing method of a HV MOS transistor device according to a third embodiment of the present invention, wherein

DETAILED DESCRIPTION

Figure 1:
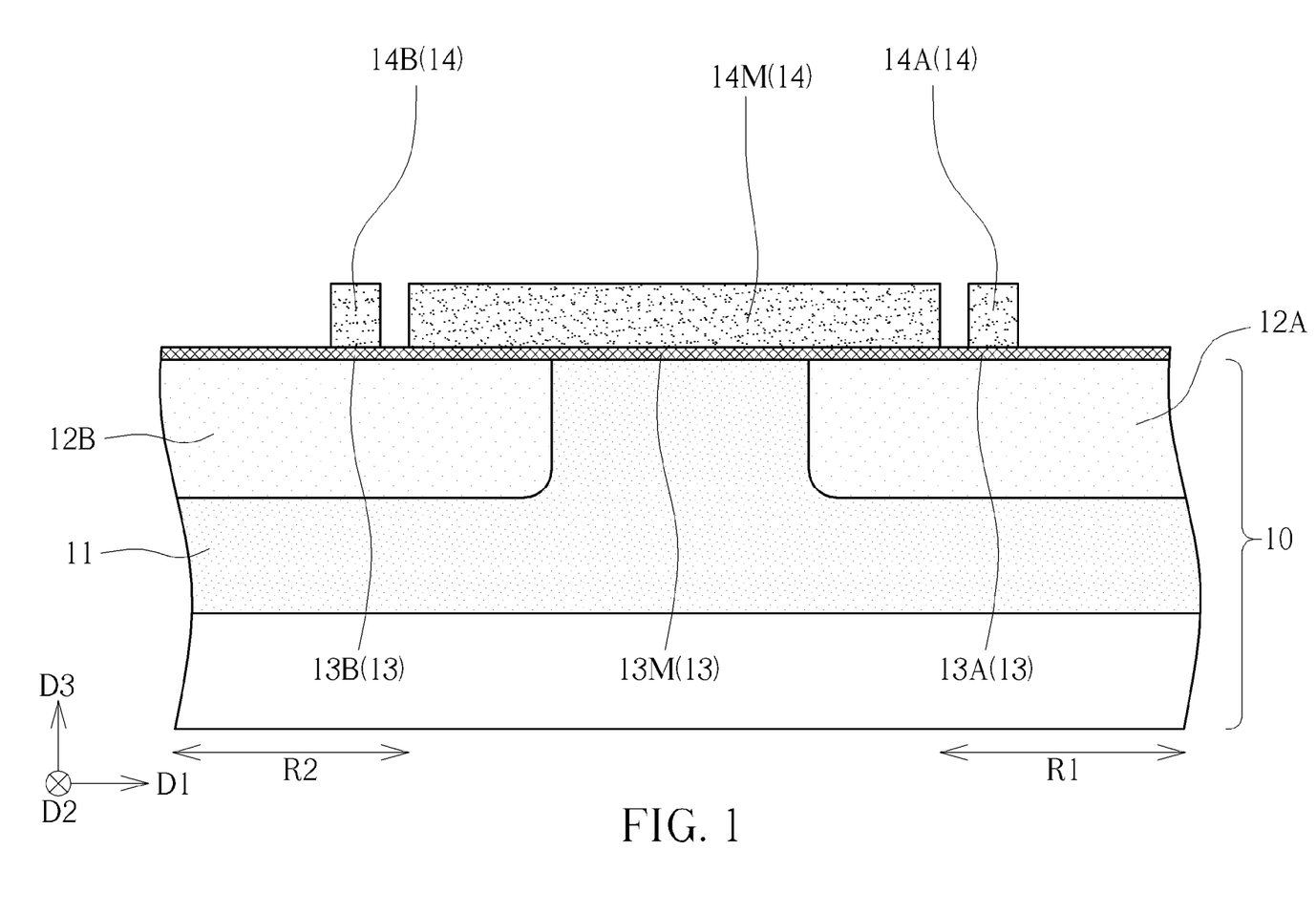
Figure 2:
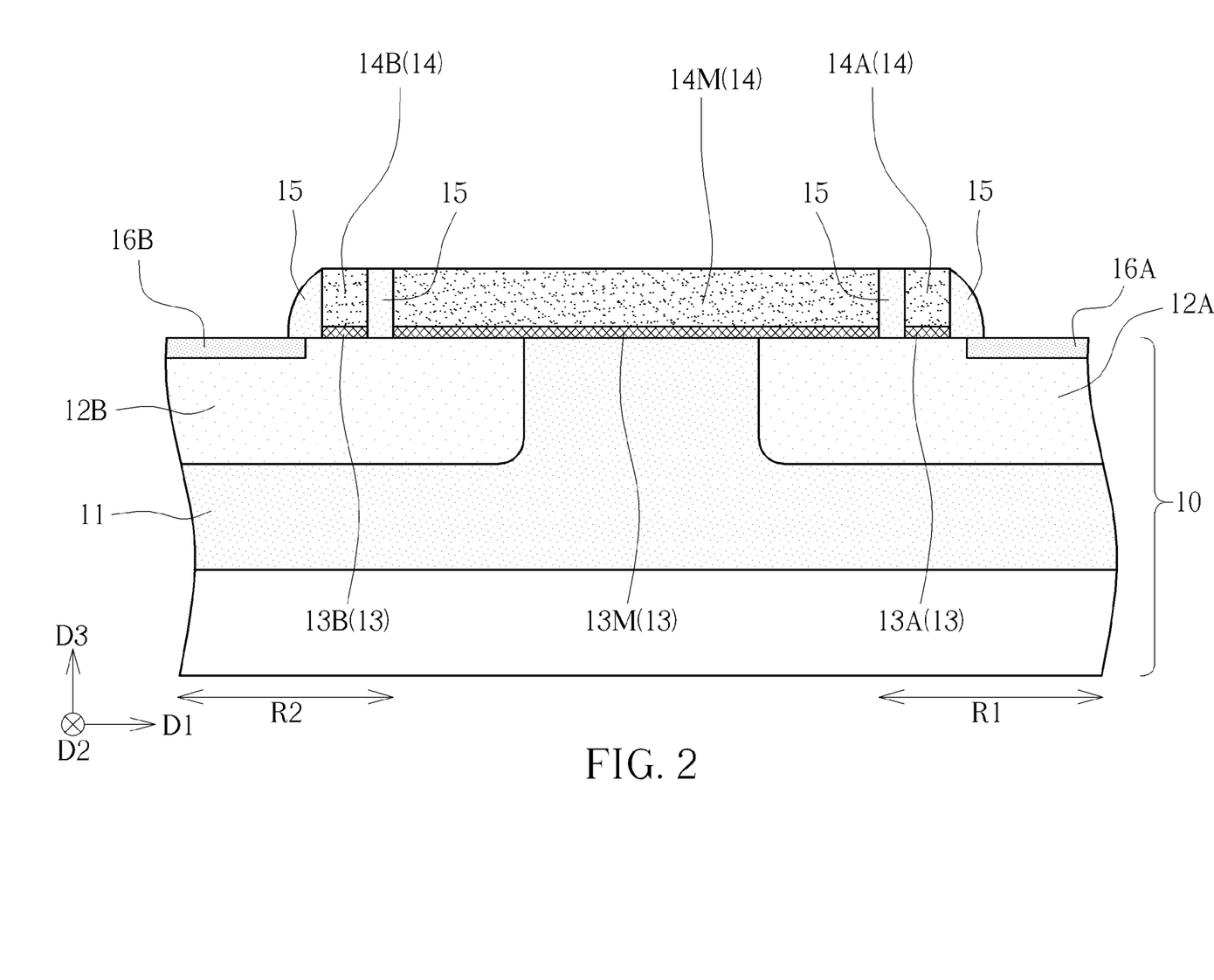
FIG. 2 is a schematic drawing in a step subsequent to FIG. 1.
Figure 3:
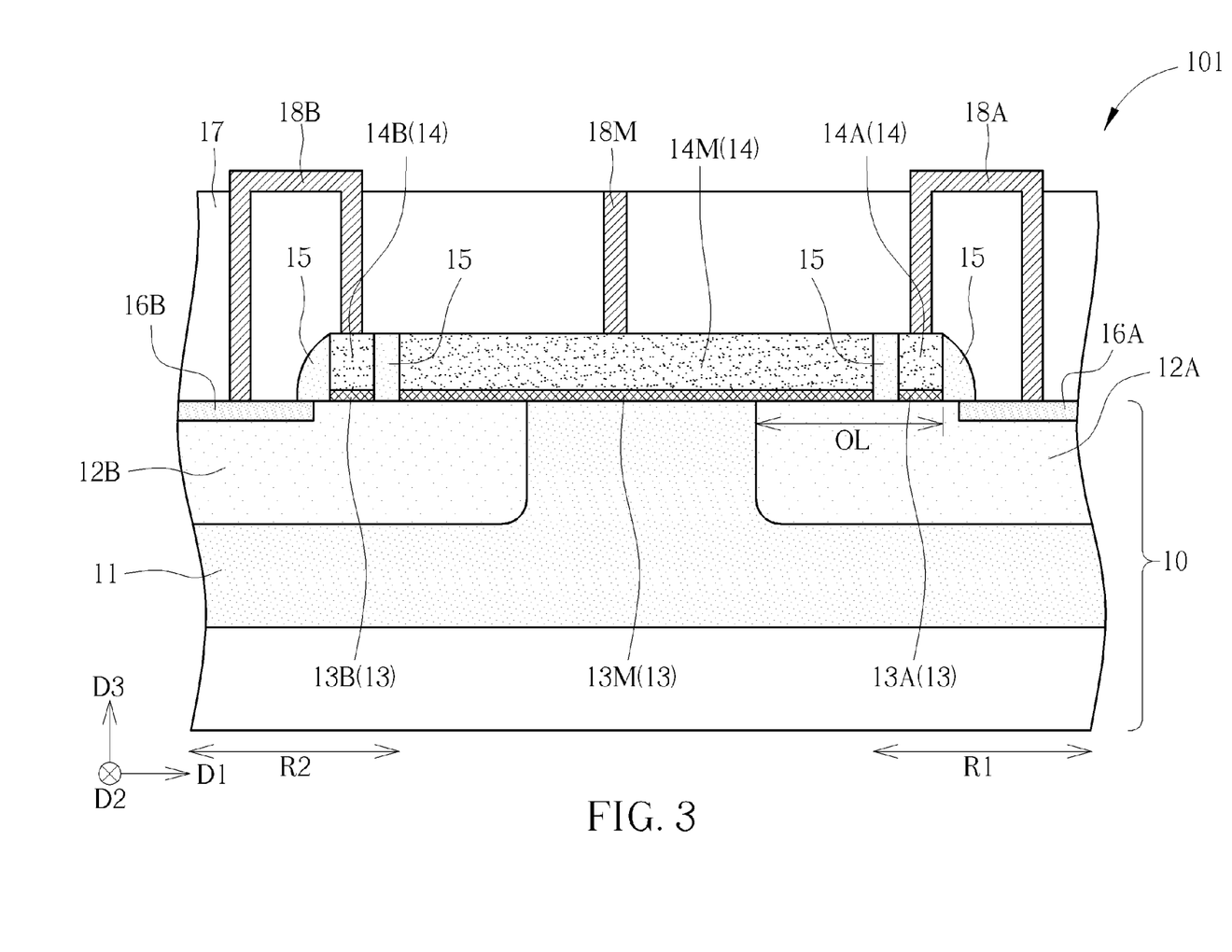
FIG. 3 is a schematic drawing in a step subsequent to FIG. 2.
Figure 4:
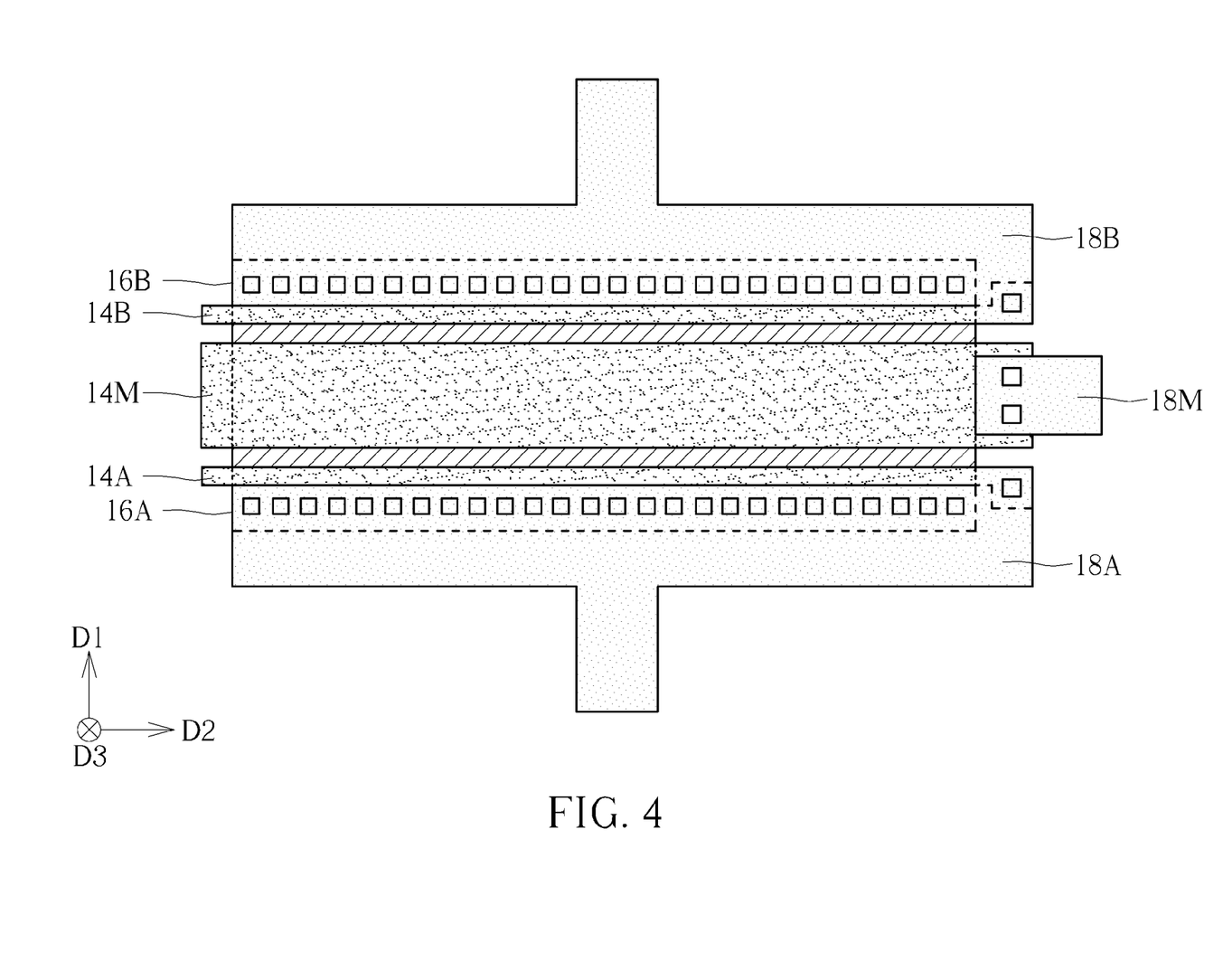
FIG. 4 is a schematic drawing illustrating a top view of the HV MOS transistor device according to the first embodiment of the present invention.

Please refer to FIGS. 1-4. FIGS. 1-3 are schematic drawings illustrating a manufacturing method of a high-voltage metal-oxide-semiconductor (HV MOS) transistor device according to a first embodiment of the present invention. FIG. 4 is a schematic drawing illustrating a top view of the HV MOS transistor device in this embodiment. The manufacturing method of the HV MOS transistor device in this embodiment includes the following steps. As sown in FIG. 1, a semiconductor substrate 10 is provided, and a patterned conductive structure 14 on the semiconductor substrate 10. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. Additionally, a well 11 such as an N-type well or a P-type well may be formed in the semiconductor substrate 10. The patterned conductive structure 14 may include a gate structure 14M, a first sub-gate structure 14A, and a second sub-gate structure 14B. The semiconductor substrate 10 has a first region R1 and a second region R2 respectively disposed on two opposite sides of the gate structure 14M. In other words, the first region R1 and the second region R2 are defined and separated by the gate structure 14M in a first direction D1, and the gate structure 14M may extend in a second direction D2 perpendicular to the first direction D1. An edge of the first region R1 is aligned with a side of the gate structure 14M, and an edge of the second region R2 is aligned with an opposite side of the gate structure 14M in the first direction D1. The first sub-gate structure 14A is disposed on the first region R1 of the semiconductor substrate 10, and the second sub-gate structure 14B is disposed on the second region R2 of the semiconductor substrate 10. The first sub-gate structure 14A is separated from the gate structure 14M, and the second sub-gate structure 14B is separated from the gate structure 14M and the first sub-gate structure 14A. In this embodiment, the gate structure 14M, the first sub-gate 14A, and the second sub-gate structure 14B are formed by the same materials such as polysilicon, metals, or other appropriate conductive materials preferably and/or the same process, but not limited thereto. In other words, the gate structure 14M, the first sub-gate 14A, and the second sub-gate structure 14B may also be formed by different materials respectively in other embodiments of the present invention. Additionally, when the gate structure 14M and/or the first sub-gate 14A is formed by a replacement metal gate (RMG) process, the gate structure 14M and/or the first sub-gate 14A may have a structure including stacked U-shaped layers in a cross-sectional view.

As shown in FIG. 1, the manufacturing method in this embodiment may further include forming a gate insulation layer 13 on the semiconductor substrate 10 before the step of forming the patterned conductive structure 14. The gate insulation layer 13 may include silicon oxide, high dielectric constant dielectric materials (such as HfOx), or other suitable insulation materials. In this embodiment, the gate insulation layer 13 may include a first part 13M, a second part 13A, and a third part 13B. The first part 13M of the gate insulation layer 13 is disposed between the gate structure 14M and the semiconductor substrate 10, the second part 13A of the gate insulation layer 13 is disposed between the first sub-gate structure 14A and the semiconductor substrate 10, and the third part 13B of the gate insulation layer 13 is disposed between the second sub-gate structure 14B and the semiconductor substrate 10. In this embodiment, the first part 13M, the second part 13A, and the third part 13B may be formed by the same material and/or the same process, but the present invention is not limited to this. In other embodiments of the present invention, the first part 13M, the second part 13A, and the third part 13B may also be formed by different materials and/or different processes respectively.

In addition, the manufacturing method in this embodiment may further include forming a first drift region 12A and a second drift region 12B in the semiconductor substrate 10 by implantation processes. The first drift region 12A is at least partially formed in the first region R1 of the semiconductor substrate 10, and the first drift region 12A may partially extend to a region under the gate structure 14M. The second drift region 12B is at least partially formed in the second region R2 of the semiconductor substrate 10, and the second drift region 12B may partially extend to a region under the gate structure 14M. In other words, the gate structure 14M may overlap a part of the first drift region 12A and a part of the second drift region 12B in a vertical direction D3. In this embodiment, the semiconductor substrate 10 may have a first conductivity type or include a first conductivity type region (such as the well 11) preferably, the first drift region 12A and the second drift region 12B may have a second conductivity type respectively, and the first conductivity type is complementary to the second conductivity type. For example, in this embodiment, the first conductivity type may be N-type and the second conductivity type may be P-type, but not limited thereto. In other words, the well 11 may be an N-type well, and the first drift region 12A and the second drift region 12B may be P-type wells, but not limited thereto. It is worth noting that, the first region R1 may be a predetermined drain side, the second region R2 may be a predetermined source side, and the second sub-gate structure 14B and/or the second drift region 12B may be selectively absent in other embodiments of the present invention.

As shown in FIG. 2, a sidewall spacer layer 15 may then be formed on sidewalls of the gate structure 14M, the first sub-gate structure 14A, and the second sub-gate structure 14B. A part of the sidewall spacer layer 15 may be disposed between the gate structure 14M and the first sub-gate structure 14A, and another part of the sidewall spacer layer 15 may be disposed between the gate structure 14M and the second sub-gate structure 14B. A gap between the gate structure 14M and the first sub-gate structure 14A may be filled with the sidewall spacer layer 15 preferably, but not limited thereto. The sidewall spacer layer 15 may be a single layer structure or a multi-layered structure, and the sidewall spacer layer 15 disposed between the gate structure 14M and the first sub-gate structure 14A may include a U-shaped spacer layer in a cross-sectional view, but not limited thereto. Subsequently, a drain region 16A is formed in the first region R1 of the semiconductor substrate 10, and a drain region 16B is formed in the second region R2 of the semiconductor substrate 10. In this embodiment, the drain region 16A may be a second conductivity type region such as a P-type doped region, and the source region 16B may be another P-type doped region preferably, when the semiconductor substrate 10 is a first conductivity type substrate such as an N-type semiconductor substrate or a semiconductor substrate including a first conductivity type region such as a N-type well, and the first drift region 12A and the second drift region 12B are second conductivity type regions such as P-type wells, but not limited thereto. The drain region 16A is formed in the first drift region 12A, and the source region 16B is formed in the second drift region 12B.

As shown in FIG. 3, a dielectric layer 17 is formed and covers the gate structure 14M, the first sub-gate structure 14A, the second sub-gate structure 14B, the drain region 16A, and the source region 16B. A first contact structure 18A is then formed on the drain region 16A and the first sub-gate structure 14A, and the drain region 16A is electrically connected to the first sub-gate structure 14A via the first contact structure 18A. Specifically, the first contact structure 18A may be partially formed in openings in the dielectric layer 17 and penetrate the dielectric layer 17 above the first sub-gate structure 14A and the drain region 16A for electrically connecting the first sub-gate structure 14A and the drain region 16A. A second contact structure 18B may be formed on the source region 16B and the second sub-gate structure 14B, and the second sub-gate structure 14B is electrically connected to the source region 16B via the second contact structure 18B penetrating the dielectric layer 17 above the second sub-gate structure 14B and the source region 16B. In addition, a third contact structure 18M may be formed on the gate structure 14M to electrically connected metal layers (not shown). A HV MOS transistor device 101 as shown in FIG. 3 may then be formed by the manufacturing method described above.

As shown in FIG. 3, the HV MOS transistor device 101 includes the semiconductor substrate 10, the gate structure 14M, the first sub-gate structure 14A, the second sub-gate structure 14B, the drain region 16A, and the source region 16B. The gate structure 14M, the first sub-gate 14A, and the second sub-gate 14B are disposed on the semiconductor substrate 10 and separated from one another. The drain region 16A and the first sub-gate structure 14A are disposed on the first region R1 at one side of the gate structure 14M; and the source region 16B and the second sub-gate structure 14B are disposed on the second region R2 at an opposite side of the gate structure 14M in the first direction D1. The drain region 16A is electrically connected to the first sub-gate structure 14A via the first contact structure 18A disposed on the drain region 16A and the first sub-gate structure 14A. Therefore, an electric potential of the first sub-gate structure 14A is equal to an electric potential of the drain region 16A, and there is no electric potential difference between the first sub-gate structure 14A and the drain region 16A. Leakage current from the drain region 16A to a bulk region in the semiconductor substrate 10 will be reduced accordingly because the gate induced drain leakage (GIDL) effect in the HV MOS transistor device 101 is reduced.

As described in the manufacturing method of this embodiment, the HV MOS transistor device 101 may further include the gate insulation layer 13, the first drift region 12A, the second drift region 12B, the sidewall spacer layer 15, the dielectric layer 17, and the second contact structure 18B. The gate insulation layer 13 is disposed on the semiconductor substrate 10. The first part 13M of the gate insulation layer 13 is disposed between the gate structure 14M and the semiconductor substrate 10, the second part 13A of the gate insulation layer 13 is disposed between the first sub-gate structure 14A and the semiconductor substrate 10, and the third part 13B of the gate insulation layer 13 is disposed between the second sub-gate structure 14B and the semiconductor substrate 10. In this embodiment, thicknesses of the first part 13M, the second part 13A, and the third part 13B of the gate insulation layer 13 may be substantially equal, but not limited thereto. The first drift region 12A and the second drift region 12B are disposed in the semiconductor substrate 10. The first drift region 12A is at least partially disposed in the first region R1 of the semiconductor substrate 10, and the second drift region 12B is at least partially disposed in the second region R2 of the semiconductor substrate 10. The first drift region 12A and the second drift region 12B are partially disposed under the gate structure 14M respectively. The drain region 16A is disposed in the first drift region 12A, and the first sub-gate structure 14A is disposed on the first drift region 12A. The source region 16B is disposed in the second drift region 12B, and the second sub-gate structure 14B is disposed on the second drift region 12B. The dielectric layer 17 is disposed on the gate structure 14M, the first sub-gate structure 14A, the second sub-gate structure 14B, the drain region 16A, and the source region 16B. The first contact structure 18A penetrates the dielectric layer 17 above the first sub-gate structure 14A and the drain region 16A for electrically connecting the first sub-gate structure 14A and the drain region 16A. The second contact structure 18B is disposed on the second sub-gate structure 14B and the source region 16B. The source region 16B is electrically connected to the second sub-gate structure 14B via the second contact structure 18B. In other embodiments of the present invention, the first sub-gate structure 14A may be replaced by a part of the first contact structure 18A, and the part of the first contact structure 18A may be directly disposed on the second part 13A of the gate insulation layer 13.

As shown in FIG. 3 and FIG. 4, the first contact structure 18A and the second contact structure 18B may contact the first sub-gate structure 14A and the second sub-gate structure 14B respectively via the openings without increasing the dimension of the HV MOS transistor device 101 in the first direction D1.

According to experiment results, in a traditional HV MOS transistor device similar to the HV MOS transistor device 101 without the electrical connection between the first sub-gate structure and the drain region, the leakage current ($I_{off}$) from the drain region to a bulk region in the semiconductor substrate is around 1307 pA, and the leakage current from the drain region 16A to a bulk region in the semiconductor substrate 10 of the HV MOS transistor device 101 may be reduced to about 0.039 pA. An overlapping distance OL of the first drift region 12A extending to be overlapped by the gate structure 14M and the first sub-gate structure 14A may become larger without increasing the leakage current substantially.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
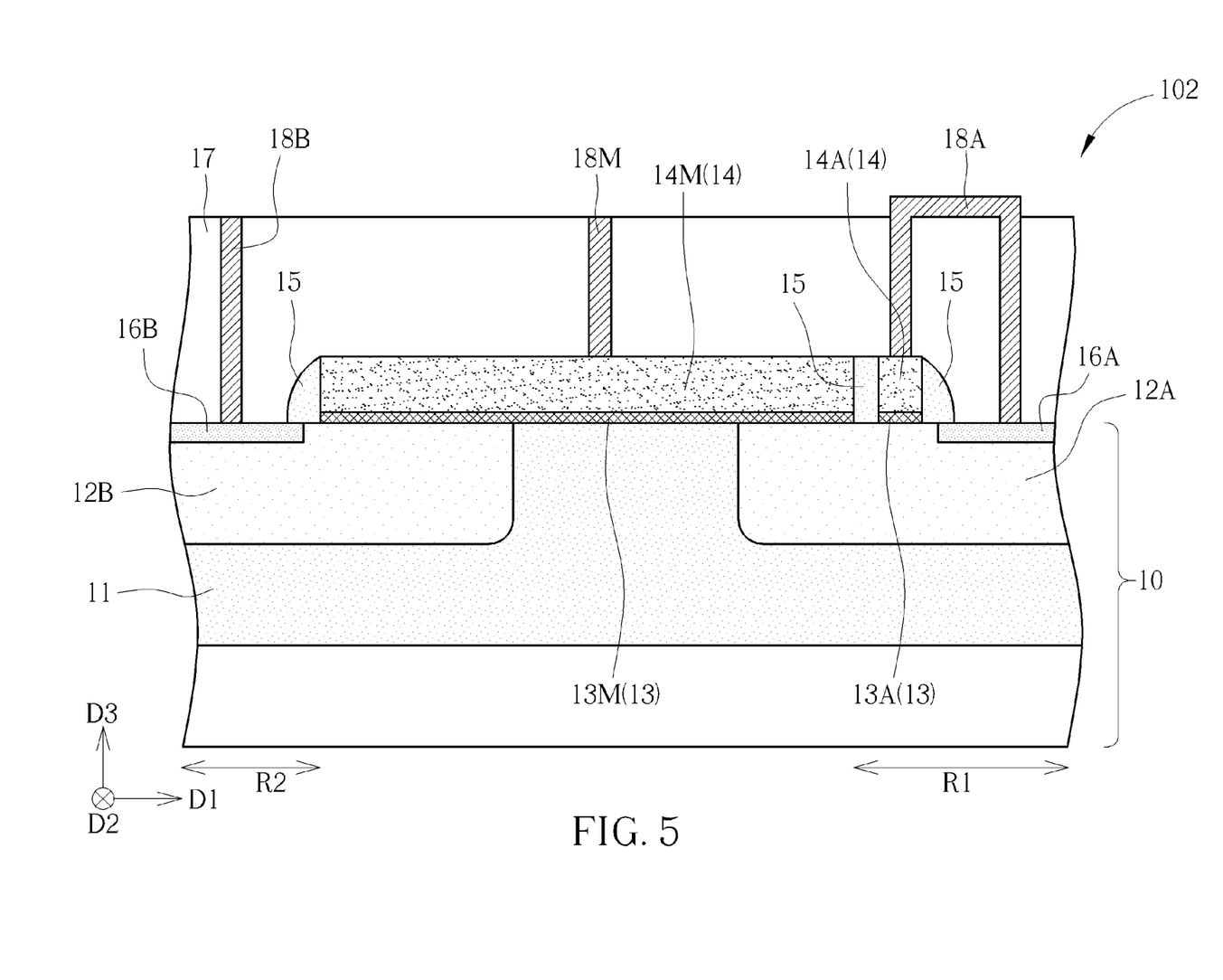
FIG. 5 is a schematic drawing illustrating a HV MOS transistor device according to a second embodiment of the present invention.

Please refer to FIG. 5. FIG. 5 is a schematic drawing illustrating a HV MOS transistor device 102 according to a second embodiment of the present invention. As shown in FIG. 5, the differences between the manufacturing method of this embodiment and the manufacturing method of the first embodiment mentioned above is that the manufacturing method of this embodiment does not include the step of forming the second sub-gate structure mentioned in the first embodiment, and the leakage current reduction performance of the HV MOS transistor device 102 may still be comparable to that of the HV MOS transistor device in the first embodiment.

Figure 6:
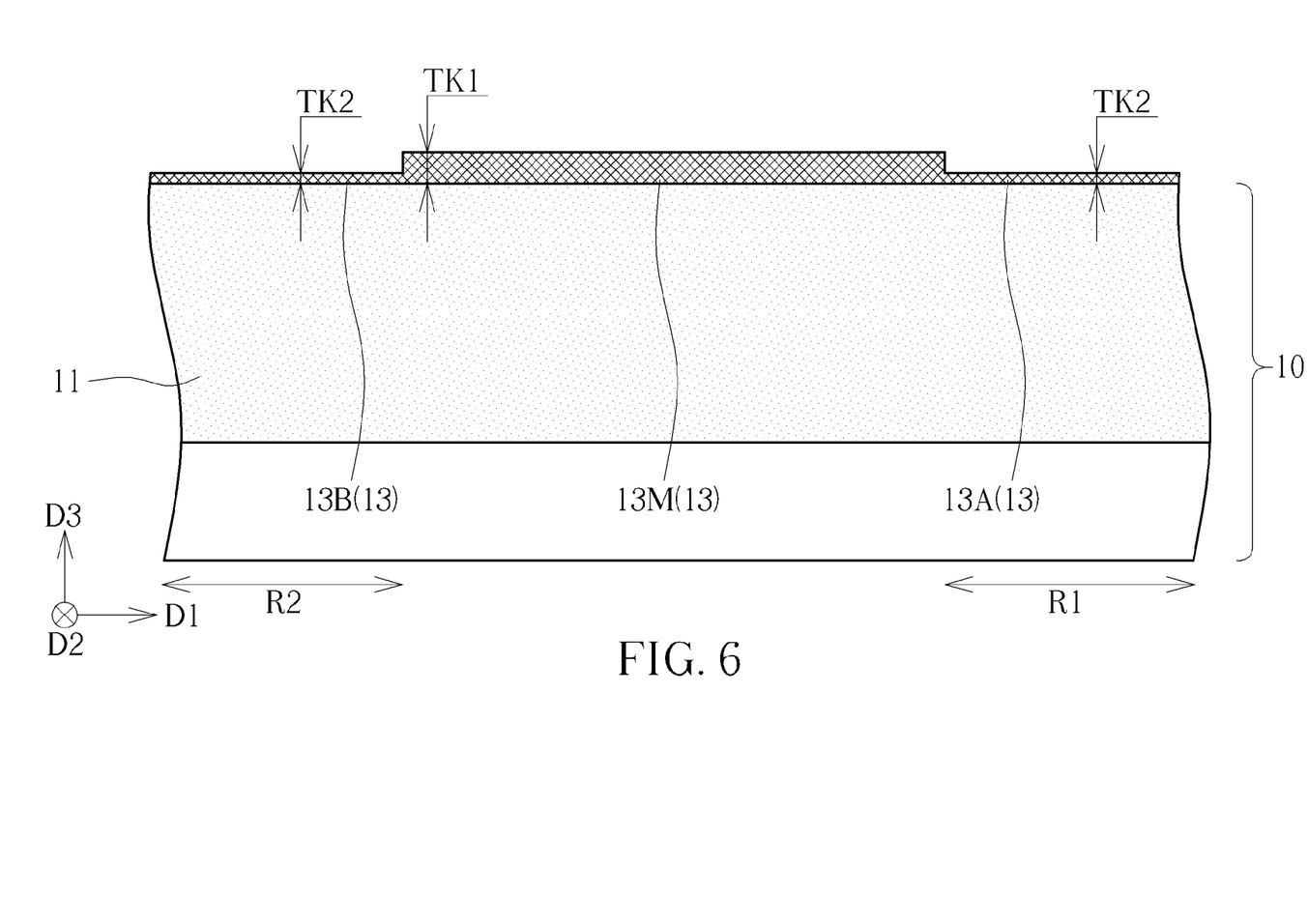
Figure 7:
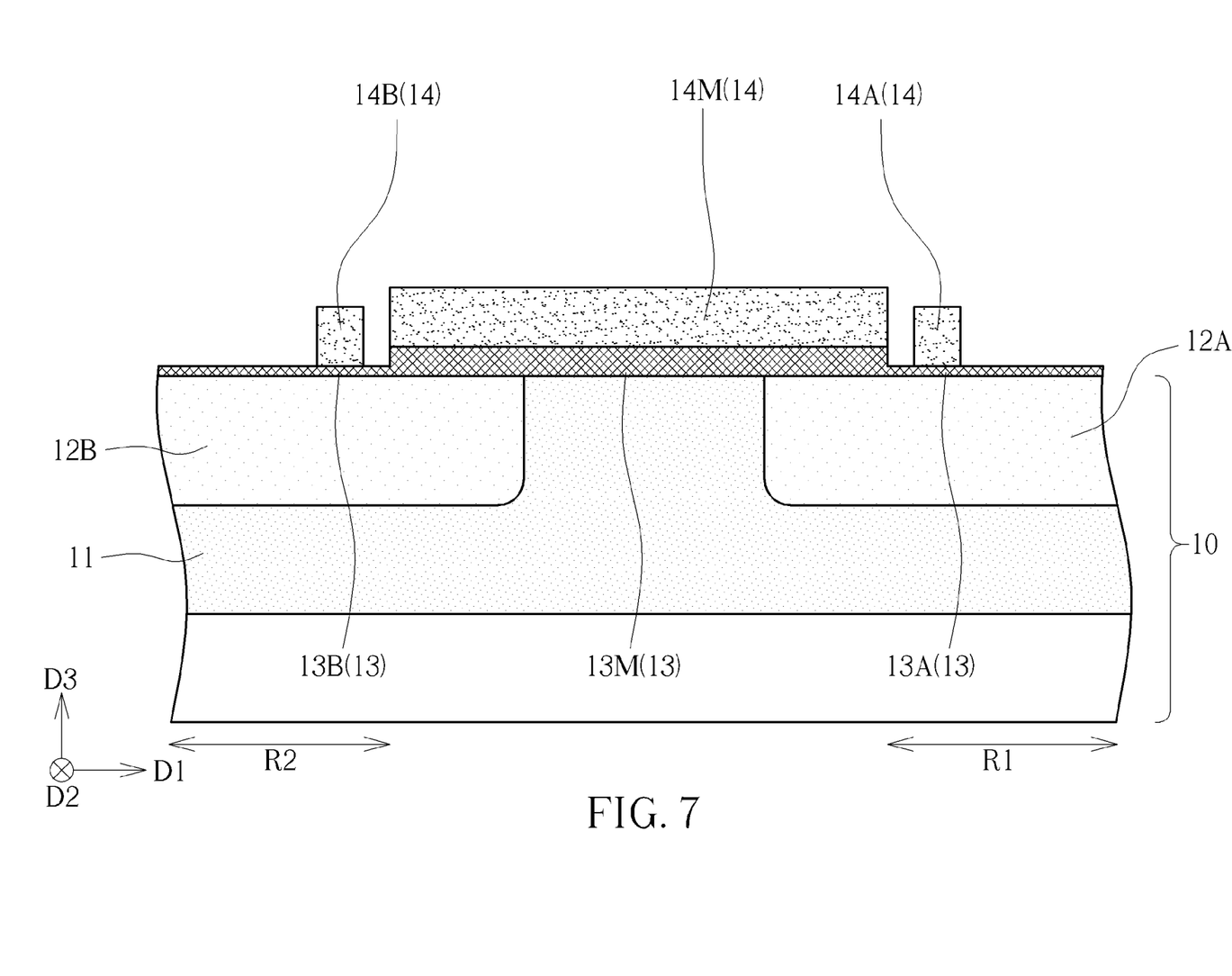
FIG. 7 is a schematic drawing in a step subsequent to FIG. 6.
Figure 8:
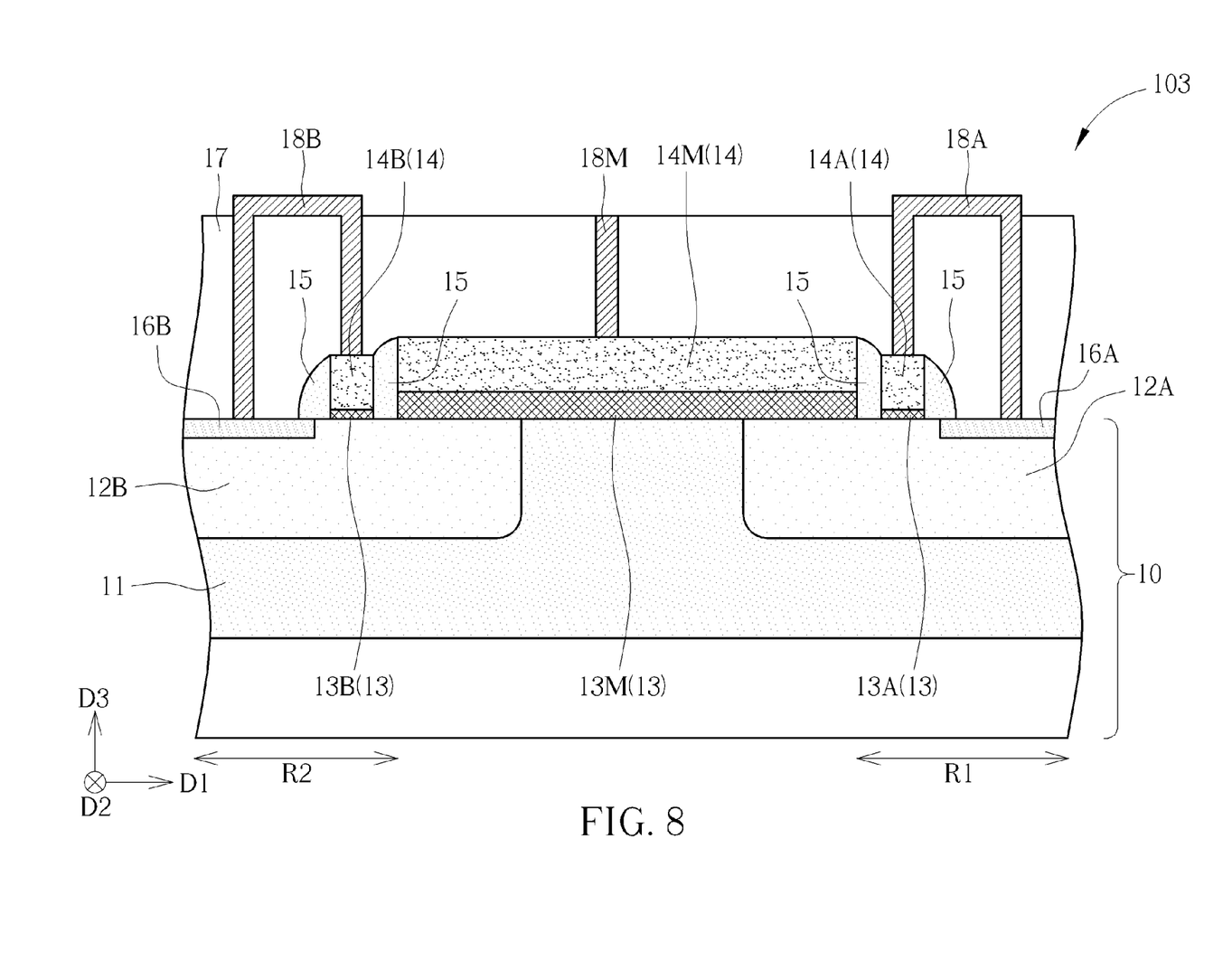
FIG. 8 is a schematic drawing in a step subsequent to FIG. 7.

Please refer to FIGS. 6-8. FIGS. 6-8 are schematic drawings illustrating a manufacturing method of a HV MOS transistor device according to a third embodiment of the present invention. As shown in FIGS. 6-8, the differences between the manufacturing method of this embodiment and the manufacturing method of the first embodiment mentioned above is that, in this embodiment, a thickness of the first part 13M is larger than a thickness of the second part 13A and a thickness of the third part 13B. For example, the first part 13M may have a first thickness TK1, and the second part 13A and the third part 13B may have a second thickness TK2. The first thickness TK1 is larger than the second thickness TK2 preferably. The second part 13A and the third part 13B of the gate insulation layer may be partially etched for being thinner than the first part 13M of the gate insulation layer 13, and the etching process may be integrated with other required process (such as the process for forming gate insulation layer with different thickness required on other part of the semiconductor substrate) without increasing any additional process step. It is worth noting that the second thickness TK2 is larger than or equal to 5% of the first thickness preferably for further improving the electric properties (such as the on current) of the HV MOS transistor device 103.

Figure 9:
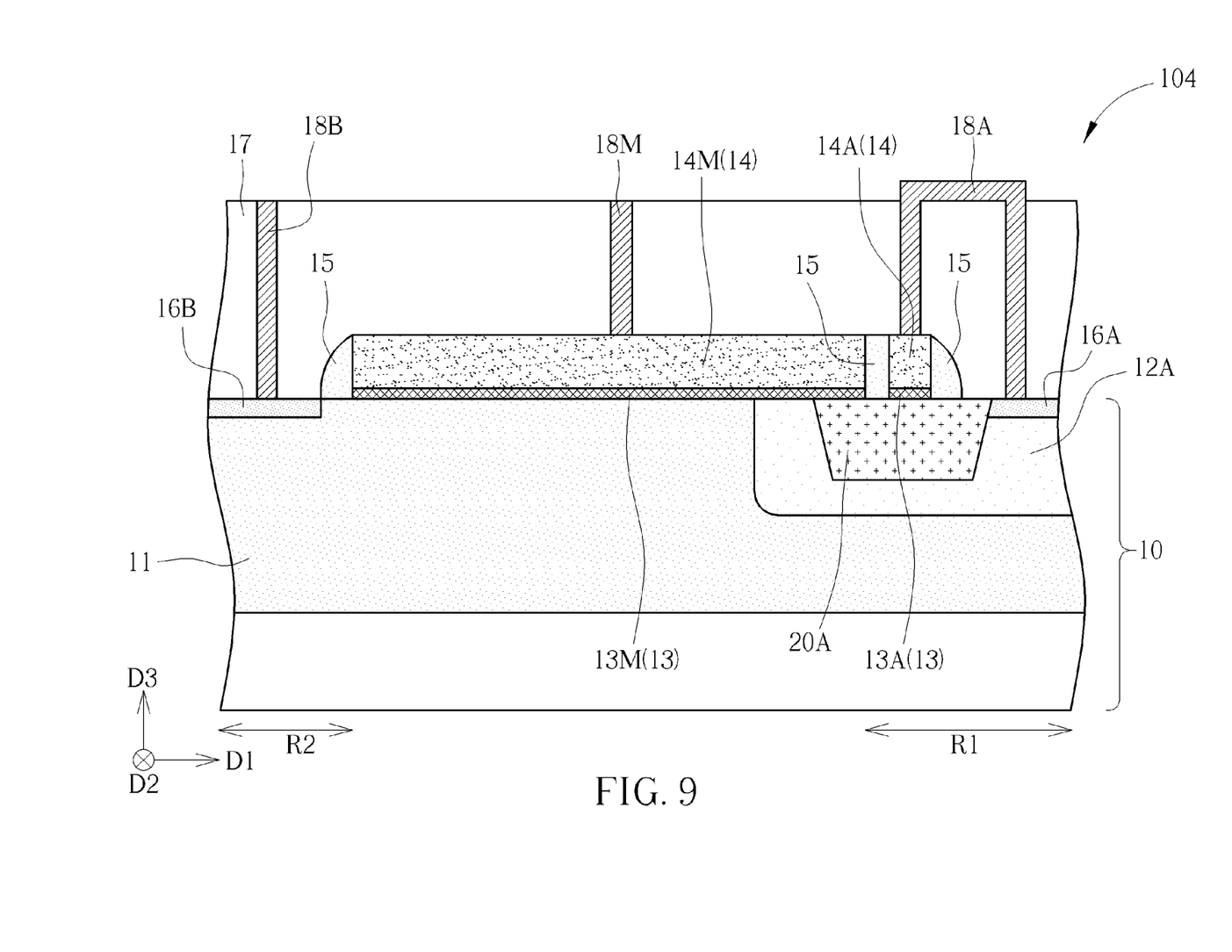
FIG. 9 is a schematic drawing illustrating a HV MOS transistor device according to a fourth embodiment of the present invention.

Please refer to FIG. 9. FIG. 9 is a schematic drawing illustrating a HV MOS transistor device 104 according to a fourth embodiment of the present invention. As shown in FIG. 9, the differences between the manufacturing method of this embodiment and the manufacturing method of the second embodiment mentioned above is that the manufacturing method of this embodiment may further include forming a first isolation structure 20A in the first drift region 12A, and at least a part of the first isolation structure 20A is disposed between the drain region 16A and the first sub-gate structure 14A in the first direction D1. The first isolation structure 20A may include a shallow trench isolation, a field oxide, or other suitable isolation structure. In other words, the HV MOS transistor device 104 may further include the first isolation structure 20A disposed in the first drift region 12A, and the HV MOS transistor device 104 may be regarded as a lateral double-diffused MOS (LDMOS) transistor device.

Figure 10:
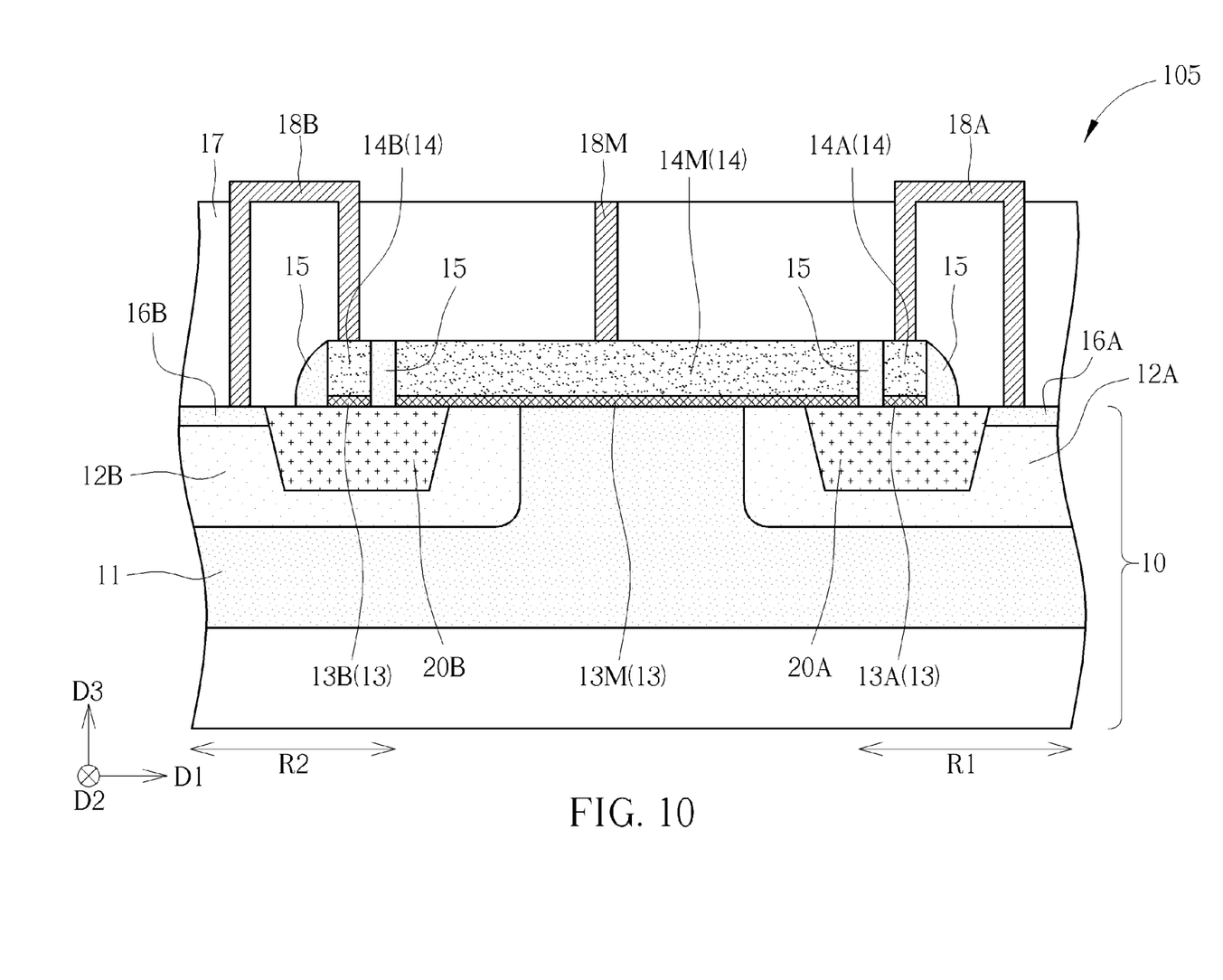
FIG. 10 is a schematic drawing illustrating a HV MOS transistor device according to a fifth embodiment of the present invention.

Please refer to FIG. 10. FIG. 10 is a schematic drawing illustrating a HV MOS transistor device 105 according to a fifth embodiment of the present invention. As shown in FIG. 10, the differences between the manufacturing method of this embodiment and the manufacturing method of the first embodiment mentioned above is that the manufacturing method of this embodiment may further include forming the first isolation structure 20A in the first drift region 12A and forming a second isolation structure 20B in the second drift region 12B. At least a part of the first isolation structure 20A is disposed between the drain region 16A and the first sub-gate structure 14A in the first direction D1, and at least a part of the second isolation structure 20B is disposed between the source region 16B and the second sub-gate structure 14B in the first direction D1. The second isolation structure 20B may include a shallow trench isolation, a field oxide, or other suitable isolation structure. In other words, the HV MOS transistor device 105 may further include the first isolation structure 20A and the second isolation structure 20B disposed in the first drift region 12A and the second drift region 12B respectively, and the HV MOS transistor device 105 may be regarded as a field drift MOS (FDMOS) transistor device.

To summarize the above descriptions, according to the manufacturing method of the HV MOS transistor device in the present invention, the sub-gate structure is electrically connected to the drain region via the first contact structure for eliminating the electric potential difference between the sub-gate structure and the drain region, and the leakage current from the drain region to the bulk region in the semiconductor substrate will be reduced accordingly because of the suppressed gate induced drain leakage (GIDL) effect. Additionally, the gate insulation layer under the sub-gate structure may become thinner than the gate insulation layer under the gate structure for further improving the electrical properties of the HV MOS transistor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a high-voltage metal-oxide-semiconductor (HV MOS) transistor device, comprising:
   providing a semiconductor substrate;
   forming a patterned conductive structure on the semiconductor substrate, wherein the patterned conductive structure comprises:
      a gate structure, wherein the semiconductor substrate has a first region and a second region respectively disposed on two opposite sides of the gate structure; and
      a first sub-gate structure disposed on the first region of the semiconductor substrate, wherein the first sub-gate structure is separated from the gate structure;
   forming a drain region in the first region of the semiconductor substrate;
   forming a first drift region in the semiconductor substrate, wherein the first drift region is at least partially formed in the first region of the semiconductor substrate, and the drain region is formed in the first drift region;
   forming a first isolation structure in the first drift region, wherein at least a part of the first isolation structure is disposed between the drain region and the first sub-gate structure, and another part of the first isolation structure is disposed under the gate structure; and
   forming a first contact structure on the drain region and the first sub-gate structure, wherein the drain region is electrically connected to the first sub-gate structure via the first contact structure.

2. The manufacturing method of claim 1, further comprising:
   forming a gate insulation layer on the semiconductor substrate before the step of forming the patterned conductive structure, wherein a first part of the gate insulation layer is disposed between the gate structure and the semiconductor substrate, and a second part of the gate insulation layer is disposed between the first sub-gate structure and the semiconductor substrate.

3. The manufacturing method of claim 2, wherein a thickness of the first part is larger than a thickness of the second part.

4. The manufacturing method of claim 3, wherein the second part of the gate insulation layer is partially etched for being thinner than the first part of the gate insulation layer.

5. The manufacturing method of claim 3, wherein the thickness of the second part is larger than or equal to 5% of the thickness of the first part.

6. The manufacturing method of claim 1, further comprising:
   forming a second drift region in the semiconductor substrate, wherein the second drift region is at least partially formed in the second region of the semiconductor substrate; and
   forming a source region in the second region of the semiconductor substrate, wherein the source region is formed in the second drift region.

7. The manufacturing method of claim 6, wherein the patterned conductive structure further comprises a second sub-gate structure disposed on the second region of the semiconductor substrate, wherein the second sub-gate structure is separated from the gate structure and the first sub-gate structure, and the second sub-gate structure is electrically connected to the source region via a second contact structure formed on the second sub-gate structure and the source region.

8. The manufacturing method of claim 1, further comprising:
   forming a sidewall spacer layer on sidewalls of the gate structure and the first sub-gate structure, wherein a part of the sidewall spacer layer is disposed between the gate structure and the first sub-gate structure.

9. A manufacturing method of a high-voltage metal-oxide-semiconductor (HV MOS) transistor device, comprising:
   providing a semiconductor substrate;
   forming a patterned conductive structure on the semiconductor substrate, wherein the patterned conductive structure comprises:

a gate structure, wherein the semiconductor substrate has a first region and a second region respectively disposed on two opposite sides of the gate structure; and a first sub-gate structure disposed on the first region of the semiconductor substrate, wherein the first sub-gate structure is separated from the gate structure;

forming a gate insulation layer on the semiconductor substrate before the step of forming the patterned conductive structure, wherein a first part of the gate insulation layer is disposed between the gate structure and the semiconductor substrate, and a second part of the gate insulation layer is disposed between the first sub-gate structure and the semiconductor substrate;

forming a drain region in the first region of the semiconductor substrate;

forming a first drift region in the semiconductor substrate, wherein the first drift region is at least partially formed in the first region of the semiconductor substrate, and the drain region is formed in the first drift region;

forming a first isolation structure in the first drift region, wherein at least a part of the first isolation structure is disposed between the drain region and the first sub-gate structure, and the second part of the gate insulation layer is disposed between the first sub-gate structure and the first isolation structure; and forming a first contact structure on the drain region and the first sub-gate structure, wherein the drain region is electrically connected to the first sub-gate structure via the first contact structure.

10. The manufacturing method of claim 9, wherein a thickness of the first part is larger than a thickness of the second part.

11. The manufacturing method of claim 10, wherein the second part of the gate insulation layer is partially etched for being thinner than the first part of the gate insulation layer.

12. The manufacturing method of claim 10, wherein the thickness of the second part is larger than or equal to 5% of the thickness of the first part.

13. The manufacturing method of claim 9, further comprising:

forming a second drift region in the semiconductor substrate, wherein the second drift region is at least partially formed in the second region of the semiconductor substrate; and forming a source region in the second region of the semiconductor substrate, wherein the source region is formed in the second drift region.

14. The manufacturing method of claim 13, wherein the patterned conductive structure further comprises a second sub-gate structure disposed on the second region of the semiconductor substrate, wherein the second sub-gate structure is separated from the gate structure and the first sub-gate structure, and the second sub-gate structure is electrically connected to the source region via a second contact structure formed on the second sub-gate structure and the source region.

15. The manufacturing method of claim 9, further comprising:

forming a sidewall spacer layer on sidewalls of the gate structure and the first sub-gate structure, wherein a part of the sidewall spacer layer is disposed between the gate structure and the first sub-gate structure.

* * * * *